(12) United States Patent
Hu et al.

(10) Patent No.: US 12,322,672 B2
(45) Date of Patent: Jun. 3, 2025

(54) SEMICONDUCTOR PACKAGE STRUCTURE AND SEMICONDUCTOR MANUFACTURING PROCESS

(71) Applicant: Advanced Semiconductor Engineering, Inc., Kaohsiung (TW)

(72) Inventors: Ian Hu, Kaohsiung (TW); Cheng-Yu Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 121 days.

(21) Appl. No.: 17/174,209

(22) Filed: Feb. 11, 2021

(65) Prior Publication Data
US 2021/0166987 A1 Jun. 3, 2021

Related U.S. Application Data

(63) Continuation of application No. 16/197,351, filed on Nov. 20, 2018, now abandoned.

(51) Int. Cl.
*H01L 23/538* (2006.01)
*H01L 21/56* (2006.01)
(Continued)

(52) U.S. Cl.
CPC ............ *H01L 23/367* (2013.01); *H01L 21/56* (2013.01); *H01L 23/3121* (2013.01);
(Continued)

(58) Field of Classification Search
CPC ... H01L 25/073; H01L 25/074; H01L 25/117; H01L 23/3121; H01L 23/5389;
(Continued)

(56) References Cited

U.S. PATENT DOCUMENTS 5,394,303 A * 2/1995 Yamaji ................ H01L 23/3107
174/557
5,875,100 A 2/1999 Yamashita
(Continued)

FOREIGN PATENT DOCUMENTS

| CN | 105280579 A | 1/2016 |
|---|---|---|
| CN | 105870076 A | 8/2016 |
| JP | H09-199823 A | 7/1997 |

OTHER PUBLICATIONS

Final Office Action for U.S. Appl. No. 16/197,351 Issued Nov. 13, 2020, 14 pages.
(Continued)

*Primary Examiner* — Sophia T Nguyen
(74) *Attorney, Agent, or Firm* — FOLEY & LARDNER LLP

(57) ABSTRACT

A semiconductor package structure includes a semiconductor die, at least one wiring structure, a metal support, a passive element, a plurality of signal vias, and a plurality of thermal structures. The semiconductor die has an active surface. The at least one wiring structure is electrically connected to the active surface of the semiconductor die. The metal support is used for supporting the semiconductor die. The passive element is electrically connected to the semiconductor die. The signal vias are electrically connecting the passive element and the semiconductor die. The thermal structures are connected to the passive element, and the thermal structures are disposed on a periphery of the at least one wiring structure.

8 Claims, 6 Drawing Sheets

(51) Int. Cl.
*H01L 23/00* (2006.01)
*H01L 23/31* (2006.01)
*H01L 23/367* (2006.01)
*H01L 25/16* (2023.01)
*H01L 23/66* (2006.01)

(52) U.S. Cl.
CPC ...... *H01L 23/5383* (2013.01); *H01L 23/5386* (2013.01); *H01L 24/19* (2013.01); *H01L 24/24* (2013.01); *H01L 25/16* (2013.01); *H01L 23/66* (2013.01); *H01L 2223/6677* (2013.01); *H01L 2224/24265* (2013.01); *H01L 2924/19042* (2013.01); *H01L 2924/19102* (2013.01)

(58) Field of Classification Search
CPC ......... H01L 23/49568; H01L 23/49805; H01L 23/645; H01L 23/642; H01L 2924/30107; H01L 2924/19041; H01L 2924/19042; H01L 2924/19043; H01F 27/292
See application file for complete search history.

(56) References Cited

U.S. PATENT DOCUMENTS

| | | | |
|---|---|---|---|
| 6,084,500 A * | 7/2000 | Kanetaka | H01F 27/292 336/200 |
| 6,297,551 B1 * | 10/2001 | Dudderar | H01L 23/49833 361/764 |
| 6,348,726 B1 * | 2/2002 | Bayan | H01L 23/3107 257/676 |
| 6,350,952 B1 | 2/2002 | Gaku et al. | |
| 6,359,341 B1 | 3/2002 | Huang et al. | |
| 6,538,210 B2 | 3/2003 | Sugaya et al. | |
| 6,709,898 B1 | 3/2004 | Ma et al. | |
| 6,909,054 B2 * | 6/2005 | Sakamoto | H01L 24/18 257/E23.178 |
| 6,914,322 B2 * | 7/2005 | Iijima | H05K 1/185 257/532 |
| 6,995,459 B2 * | 2/2006 | Lee | H01L 24/49 257/676 |
| 7,144,517 B1 | 12/2006 | Yang et al. | |
| 7,226,811 B1 | 6/2007 | McLellan et al. | |
| 7,247,526 B1 | 7/2007 | Fan et al. | |
| 7,270,867 B1 | 9/2007 | Kwan et al. | |
| 7,443,012 B2 * | 10/2008 | Yamaguchi | H01L 23/3128 257/667 |
| 7,786,837 B2 * | 8/2010 | Hebert | H01L 23/645 336/200 |
| 7,842,887 B2 * | 11/2010 | Sakamoto | H01L 23/49827 361/795 |
| 7,858,443 B2 | 12/2010 | Powell et al. | |
| 8,115,285 B2 * | 2/2012 | Chen | H01L 21/4832 257/676 |
| 8,241,956 B2 | 8/2012 | Camacho et al. | |
| 8,564,092 B2 * | 10/2013 | Burgyan | H01L 23/552 257/E29.325 |
| 8,674,487 B2 * | 3/2014 | Yu | H01L 21/4832 257/676 |
| 8,837,168 B2 * | 9/2014 | Chen | H05K 3/30 336/200 |
| 8,891,241 B2 * | 11/2014 | Chao | H05K 1/0236 257/659 |
| 8,937,381 B1 * | 1/2015 | Dunlap | H01L 24/19 257/784 |
| 8,975,726 B2 * | 3/2015 | Chen | H01L 21/76885 257/532 |
| 9,064,859 B2 | 6/2015 | Chi et al. | |
| 9,107,290 B1 * | 8/2015 | Chen | H05K 3/0061 |
| 9,196,575 B1 * | 11/2015 | Lee | H01L 23/49568 |
| 9,214,437 B1 | 12/2015 | Hsu et al. | |
| 9,269,691 B2 | 2/2016 | Chi et al. | |
| 9,391,027 B2 * | 7/2016 | Chauhan | H01L 23/34 |
| 9,398,694 B2 * | 7/2016 | Merkle | H01L 23/66 |
| 9,508,634 B2 | 11/2016 | Liu | |
| 9,570,381 B2 * | 2/2017 | Lu | H01L 23/49541 |
| 9,640,474 B1 | 5/2017 | Cho et al. | |
| 9,693,445 B2 * | 6/2017 | Ku | H05K 1/115 |
| 9,698,130 B2 * | 7/2017 | Weis | H01L 24/20 |
| 9,812,426 B1 | 11/2017 | Wang et al. | |
| 9,848,500 B2 * | 12/2017 | Merkle | H01L 23/66 |
| 9,997,445 B2 | 6/2018 | Yow et al. | |
| 10,104,797 B2 | 10/2018 | Zeng | |
| 10,157,888 B1 | 12/2018 | Lin et al. | |
| 10,186,502 B1 | 1/2019 | Lerner | |
| 10,412,821 B1 * | 9/2019 | Lim | H05K 1/021 |
| 10,424,573 B1 | 9/2019 | Lim | |
| 10,433,424 B2 * | 10/2019 | Liu | H05K 1/185 |
| 10,700,035 B2 | 6/2020 | Tuominen et al. | |
| 10,720,276 B2 * | 7/2020 | Ueyama | H01F 17/0013 |
| 10,854,551 B2 * | 12/2020 | Yu | H01L 25/0652 |
| 10,879,162 B2 * | 12/2020 | Jeng | H01L 21/568 |
| 2001/0008305 A1 | 7/2001 | McLellan et al. | |
| 2003/0029637 A1 * | 2/2003 | Barcley | H05K 1/0206 174/262 |
| 2003/0060172 A1 | 3/2003 | Kuriyama et al. | |
| 2003/0134455 A1 * | 7/2003 | Cheng | H01L 23/49822 438/106 |
| 2003/0141105 A1 * | 7/2003 | Sugaya | H01L 21/56 257/E23.125 |
| 2003/0169575 A1 | 9/2003 | Ikuta et al. | |
| 2004/0032011 A1 * | 2/2004 | Warner | H01L 23/49531 257/676 |
| 2004/0041270 A1 * | 3/2004 | Shimizu | H01L 23/49833 257/E23.062 |
| 2004/0140551 A1 | 7/2004 | Usui et al. | |
| 2004/0217450 A1 * | 11/2004 | Li | H01L 23/49503 257/E23.037 |
| 2005/0029666 A1 * | 2/2005 | Kurihara | H01L 24/81 257/772 |
| 2005/0048759 A1 | 3/2005 | Hsu | |
| 2005/0212078 A1 | 9/2005 | Kwon et al. | |
| 2005/0230835 A1 * | 10/2005 | Sunohara | H05K 1/185 257/E23.178 |
| 2005/0258533 A1 * | 11/2005 | Kumano | H01L 25/0657 257/E23.105 |
| 2005/0284607 A1 * | 12/2005 | Barcley | H05K 1/0206 165/905 |
| 2006/0001152 A1 | 1/2006 | Hu | |
| 2006/0097379 A1 | 5/2006 | Wang | |
| 2006/0145328 A1 * | 7/2006 | Hsu | H05K 1/185 257/690 |
| 2006/0263930 A1 | 11/2006 | Ito | |
| 2007/0013042 A1 | 1/2007 | Henell et al. | |
| 2007/0262452 A1 | 11/2007 | Oi | |
| 2008/0067649 A1 * | 3/2008 | Matsunaga | H01L 23/49541 438/123 |
| 2008/0280394 A1 * | 11/2008 | Murtuza | H01L 24/97 438/109 |
| 2008/0309442 A1 * | 12/2008 | Hebert | H01F 27/292 257/738 |
| 2009/0032933 A1 * | 2/2009 | Tracht | H01L 24/19 438/118 |
| 2009/0230524 A1 * | 9/2009 | Chien | H01L 23/49582 257/676 |
| 2009/0237900 A1 * | 9/2009 | Origuchi | H01L 23/49838 361/763 |
| 2009/0283882 A1 * | 11/2009 | Hsieh | H01L 24/49 257/676 |
| 2009/0302445 A1 | 12/2009 | Pagaila et al. | |
| 2010/0013106 A1 * | 1/2010 | Otremba | H01L 25/16 361/783 |
| 2010/0044843 A1 * | 2/2010 | Chang Chien | H01L 21/4832 257/676 |
| 2010/0044850 A1 | 2/2010 | Lin et al. | |
| 2010/0103634 A1 * | 4/2010 | Funaya | H01L 25/0657 174/262 |
| 2010/0181658 A1 | 7/2010 | Yamashita | |
| 2010/0213588 A1 * | 8/2010 | Hsieh | H01L 24/19 257/676 |

(56) References Cited

U.S. PATENT DOCUMENTS

| | | |
|---|---|---|
| 2010/0213589 A1* | 8/2010 | Hsieh ................ H01L 23/5389 257/676 |
| 2010/0258920 A1* | 10/2010 | Chien ................ H01L 23/3107 438/123 |
| 2010/0258934 A1* | 10/2010 | Chang Chien ........ H01L 21/565 257/E23.116 |
| 2010/0295170 A1* | 11/2010 | Komura .............. H01L 23/5389 257/E23.102 |
| 2011/0057713 A1 | 3/2011 | Kawanami et al. |
| 2011/0090648 A1* | 4/2011 | Chen .................... H01L 23/645 361/818 |
| 2011/0108971 A1* | 5/2011 | Ewe ................... H01L 23/5389 438/109 |
| 2011/0140254 A1 | 6/2011 | Tsai et al. |
| 2011/0148545 A1 | 6/2011 | Choudhury et al. |
| 2011/0175213 A1 | 7/2011 | Mori et al. |
| 2011/0193491 A1* | 8/2011 | Choutov .............. H05B 45/325 315/291 |
| 2011/0212577 A1* | 9/2011 | Hebert .................... H01L 24/49 438/123 |
| 2011/0227208 A1 | 9/2011 | Kim et al. |
| 2011/0284989 A1* | 11/2011 | Umeno ............. H01L 23/49531 257/E27.024 |
| 2011/0291249 A1* | 12/2011 | Chi ..................... H01L 23/5389 438/122 |
| 2012/0014079 A1* | 1/2012 | Chen ...................... H05K 1/181 361/813 |
| 2012/0032340 A1* | 2/2012 | Choi .................. H01L 23/3128 257/777 |
| 2012/0038034 A1 | 2/2012 | Shin et al. |
| 2012/0217614 A1* | 8/2012 | Burgyan .............. H01L 23/552 257/532 |
| 2012/0281379 A1* | 11/2012 | Shimada ........... H01L 23/49827 361/782 |
| 2012/0326286 A1 | 12/2012 | Camacho |
| 2013/0001756 A1 | 1/2013 | Chen et al. |
| 2013/0025839 A1 | 1/2013 | Egitto et al. |
| 2013/0026632 A1 | 1/2013 | Kikuchi et al. |
| 2013/0056871 A1 | 3/2013 | Yu et al. |
| 2013/0069222 A1 | 3/2013 | Camacho |
| 2013/0105966 A1 | 5/2013 | Kelkar et al. |
| 2013/0127037 A1 | 5/2013 | Mori et al. |
| 2013/0141886 A1* | 6/2013 | Chen ...................... H05K 1/18 29/841 |
| 2013/0207255 A1 | 8/2013 | Magnus et al. |
| 2013/0256900 A1 | 10/2013 | McConnelee et al. |
| 2013/0307113 A1* | 11/2013 | Kunimoto ......... H01L 23/49827 257/528 |
| 2014/0008777 A1 | 1/2014 | Loh et al. |
| 2014/0126156 A1* | 5/2014 | Naganuma ........... H05K 1/0233 361/720 |
| 2014/0133117 A1 | 5/2014 | Saji et al. |
| 2014/0175624 A1* | 6/2014 | Palm .................. H01L 23/5389 438/118 |
| 2014/0211437 A1* | 7/2014 | Ueta ...................... H05K 1/186 361/761 |
| 2014/0264792 A1 | 9/2014 | Yang et al. |
| 2014/0302640 A1 | 10/2014 | Qin et al. |
| 2014/0328038 A1* | 11/2014 | Kato ...................... H01L 24/19 361/761 |
| 2014/0367848 A1* | 12/2014 | Chi ...................... H01L 21/561 257/737 |
| 2015/0035621 A1* | 2/2015 | Ahn ........................ H01G 4/40 333/184 |
| 2015/0084207 A1* | 3/2015 | Chauhan ............. H01L 23/5386 438/118 |
| 2015/0108635 A1 | 4/2015 | Liang et al. |
| 2015/0155215 A1* | 6/2015 | Luan ................. H01L 23/49541 438/123 |
| 2015/0179611 A1* | 6/2015 | Lu .................... H01L 23/5389 257/659 |
| 2015/0235935 A1 | 8/2015 | Lin et al. |
| 2015/0235993 A1* | 8/2015 | Cheng ................ H01L 23/5389 438/107 |
| 2015/0255380 A1* | 9/2015 | Chen .................... H01L 23/367 361/707 |
| 2015/0255418 A1 | 9/2015 | Gowda et al. |
| 2015/0255429 A1* | 9/2015 | Katkar .............. H01L 21/76898 257/774 |
| 2015/0348916 A1 | 12/2015 | Chen et al. |
| 2015/0348934 A1 | 12/2015 | Qin et al. |
| 2016/0005716 A1 | 1/2016 | Yu et al. |
| 2016/0035644 A1 | 2/2016 | Olsen et al. |
| 2016/0111354 A1* | 4/2016 | Luan ................ H01L 23/49531 438/122 |
| 2016/0133558 A1 | 5/2016 | Stahr et al. |
| 2016/0135299 A1 | 5/2016 | Hsu et al. |
| 2016/0172274 A1* | 6/2016 | Yoon ...................... H01L 24/24 257/664 |
| 2016/0190108 A1 | 6/2016 | Lee et al. |
| 2016/0227641 A1* | 8/2016 | Ku ......................... H05K 1/112 |
| 2016/0233140 A1* | 8/2016 | Lai ..................... H01L 25/0655 |
| 2016/0233292 A1* | 8/2016 | Chen ..................... H01L 28/10 |
| 2016/0284672 A1* | 9/2016 | Katkar ............... H01L 25/0652 |
| 2016/0300782 A1 | 10/2016 | Chen et al. |
| 2016/0322295 A1* | 11/2016 | Kobayashi ........... H05K 3/4682 |
| 2016/0336299 A1* | 11/2016 | Marimuthu ....... H01L 23/49838 |
| 2016/0352246 A1 | 12/2016 | Lai et al. |
| 2017/0018478 A1 | 1/2017 | Maple et al. |
| 2017/0018501 A1 | 1/2017 | Maple et al. |
| 2017/0040266 A1 | 2/2017 | Lin et al. |
| 2017/0047308 A1 | 2/2017 | Ho et al. |
| 2017/0062360 A1 | 3/2017 | Chang et al. |
| 2017/0069558 A1 | 3/2017 | Bang et al. |
| 2017/0133355 A1* | 5/2017 | Chen .................... H01L 23/645 |
| 2017/0148746 A1 | 5/2017 | Chiu et al. |
| 2017/0170136 A1* | 6/2017 | Seo ....................... H01L 23/481 |
| 2017/0194233 A1 | 7/2017 | Castro et al. |
| 2017/0207197 A1 | 7/2017 | Yu et al. |
| 2017/0208677 A1 | 7/2017 | Kogure et al. |
| 2017/0365543 A1 | 12/2017 | Lee et al. |
| 2018/0019178 A1 | 1/2018 | Lin et al. |
| 2018/0019194 A1 | 1/2018 | Papillon |
| 2018/0040531 A1 | 2/2018 | Lin et al. |
| 2018/0053722 A1* | 2/2018 | Cho ..................... H01L 23/5386 |
| 2018/0054120 A1* | 2/2018 | Cho ......................... H03K 7/08 |
| 2018/0061730 A1* | 3/2018 | Anderson ......... H01L 23/49833 |
| 2018/0122772 A1* | 5/2018 | Kim ..................... H01L 23/5227 |
| 2018/0130761 A1 | 5/2018 | Kim et al. |
| 2018/0138149 A1 | 5/2018 | Chou et al. |
| 2018/0151466 A1 | 5/2018 | Hsu et al. |
| 2018/0166211 A1* | 6/2018 | Takatsuji ............... H02M 3/156 |
| 2018/0204802 A1 | 7/2018 | Lin et al. |
| 2018/0261535 A1 | 9/2018 | Lin et al. |
| 2018/0301404 A1 | 10/2018 | Morroni et al. |
| 2018/0350747 A1 | 12/2018 | Hwang et al. |
| 2018/0352658 A1 | 12/2018 | Yang |
| 2019/0006283 A1 | 1/2019 | Wang et al. |
| 2019/0035759 A1 | 1/2019 | Tsai et al. |
| 2019/0067207 A1 | 2/2019 | Hu |
| 2019/0067261 A1* | 2/2019 | Chang ..................... H01L 28/10 |
| 2019/0103335 A1 | 4/2019 | Mizuno et al. |
| 2019/0115287 A1 | 4/2019 | Derai et al. |
| 2019/0122956 A1 | 4/2019 | Muneishi |
| 2019/0122969 A1 | 4/2019 | Lee et al. |
| 2019/0131252 A1 | 5/2019 | Kim |
| 2019/0131273 A1* | 5/2019 | Chen ...................... H01L 21/568 |
| 2019/0131283 A1 | 5/2019 | Chen et al. |
| 2019/0148262 A1 | 5/2019 | Pei et al. |
| 2019/0164783 A1 | 5/2019 | Huang et al. |
| 2019/0164862 A1 | 5/2019 | Kim et al. |
| 2019/0164871 A1 | 5/2019 | Lee et al. |
| 2019/0182997 A1 | 6/2019 | Lin et al. |
| 2019/0189601 A1* | 6/2019 | Kayashima ........... H01L 23/367 |
| 2019/0267336 A1 | 8/2019 | Raorane et al. |
| 2019/0287938 A1 | 9/2019 | Kim et al. |
| 2019/0333869 A1* | 10/2019 | Teng .................... H01L 21/4853 |
| 2020/0006196 A1 | 1/2020 | Lin et al. |
| 2020/0013707 A1* | 1/2020 | Jeng .................... H01L 23/5389 |
| 2020/0043853 A1 | 2/2020 | Kim et al. |
| 2020/0075571 A1 | 3/2020 | Chen et al. |

(56) References Cited

U.S. PATENT DOCUMENTS

| | | |
|---|---|---|
| 2020/0135669 A1 | 4/2020 | Liang et al. |
| 2020/0135671 A1 | 4/2020 | Chen et al. |
| 2020/0144173 A1 | 5/2020 | Kim et al. |
| 2020/0144237 A1 | 5/2020 | Kang et al. |
| 2020/0161206 A1 | 5/2020 | Hu et al. |
| 2020/0273783 A1 | 8/2020 | Sankman et al. |
| 2022/0336385 A1* | 10/2022 | Wang ............... H01L 23/49827 |

OTHER PUBLICATIONS

Non-Final Office Action for U.S. Appl. No. 16/197,351 Issued Jul. 9, 2020, 24 pages.

Office Action from counterpart Chinese Patent Application No. 201910833308.7, issued on Jul. 13, 2022, 10 pages.

Search Report (with English translation) from counterpart Chinese Patent Application No. 201910833308.7, issued on Jul. 13, 2022, 6 pages.

\* cited by examiner

SEMICONDUCTOR PACKAGE STRUCTURE AND SEMICONDUCTOR MANUFACTURING PROCESS

CROSS-REFERENCE TO RELATED APPLICATION

This application is a continuation of U.S. patent application Ser. No. 16/197,351 filed Nov. 20, 2018, the contents of which is incorporated herein by reference in its entirety.

BACKGROUND

1. Field of the Disclosure

The present disclosure relates to a semiconductor package structure and a semiconductor manufacturing process, and more particularly to a semiconductor package structure including thermal structure and a semiconductor manufacturing process.

2. Description of the Related Art

The trend for an electronic product is to highly integrate the elements so as to form a minimum size and obtain a best electrical performance. However, the multiple heat sources problem may occur due to multiple elements. If the heat from the elements is transmitted to a main element, a junction temperature of the main element may be too high to meet a maximum specified temperature.

SUMMARY

In some embodiments, according to an aspect, a semiconductor package structure includes a semiconductor die, at least one wiring structure, a metal support, a passive element, a plurality of signal vias, and a plurality of thermal structures. The semiconductor die has an active surface. The at least one wiring structure is electrically connected to the active surface of the semiconductor die. The metal support is used for supporting the semiconductor die. The passive element is electrically connected to the semiconductor die. The signal vias are electrically connecting the passive element and the semiconductor die. The thermal structures are connected to the passive element, and the thermal structures are disposed on a periphery of the at least one wiring structure.

In some embodiments, according to an aspect, a semiconductor package structure includes a semiconductor die, at least one wiring structure, a passive element, a plurality of signal vias, and a plurality of thermal vias. The semiconductor die has an active surface. The at least one wiring structure is electrically connected to the active surface of the semiconductor die. The passive element is electrically connected to the semiconductor die. The signal vias are electrically connecting the passive element and the semiconductor die. The thermal vias are connected to the passive element, and the thermal vias are disposed on a periphery of the at least one wiring structure.

In some embodiments, according to another aspect, a semiconductor manufacturing process includes: (a) providing a semiconductor package, wherein the semiconductor package includes a semiconductor die, at least one wiring structure, a plurality of signal vias and a plurality of thermal structures, the semiconductor die includes an active surface, the at least one wiring structure is electrically connected to the active surface of the semiconductor die, the signal vias are electrically connected to the semiconductor die, the thermal structures are disposed on a periphery of the at least one wiring structure; and (b) mounting a passive element on the semiconductor package, wherein the passive element is electrically connected to the signal vias and is connected to the thermal structures.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
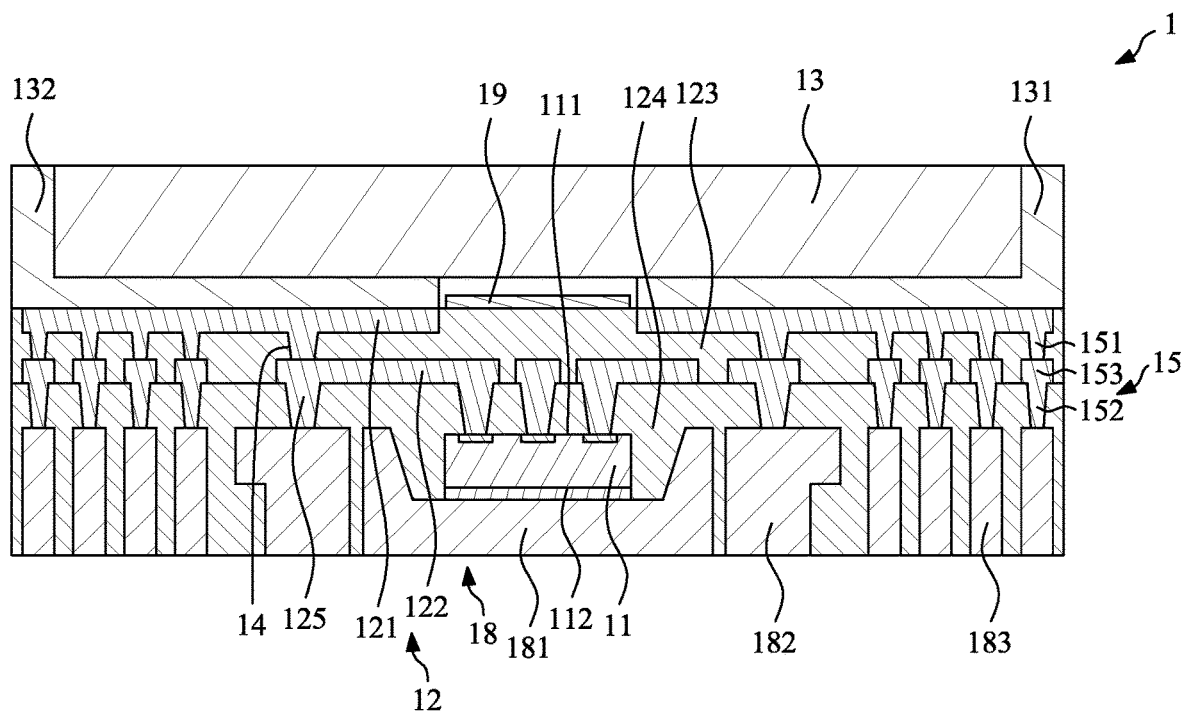
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the semiconductor-associated industry, according to the design specification of the semiconductor package product, the junction temperature of the semiconductor die in the semiconductor package product cannot exceed about 150° C. In a comparative example of semiconductor package structure, a passive element is electrically connected to a semiconductor die. For example, an inductor is disposed on a semiconductor die. By a simulation, before disposing the inductor, the junction temperature of the semiconductor die is about 136° C. After disposing the inductor, the junction temperature of the semiconductor die is higher than 154° C. Since the heat from the inductor is transmitted to the semiconductor die by the signal paths, the junction temperature of the semiconductor die may be above about 150° C. Thus, the semiconductor package structure product cannot meet the above design specification.

To address these issues, some comparative embodiments of this disclosure are directed to semiconductor package structures and methods of manufacturing semiconductor package structures that include an additional heat dissipating device such as a copper plate or a heat sink with a plurality of heat dissipating fins. However, such additional heat dissipating device will increase the total thickness or volume of the semiconductor package structure. In addition, some comparative embodiments of this disclosure are directed to semiconductor package structures and methods of manufacturing semiconductor package structures that include a thickened prepreg or a thickened die pad. However, the junction temperature of the semiconductor package structure with such thickened prepreg or thickened die pad may be about 154° C., which still can't meet the above specification.

To address at least the above concerns, an embodiment of the present disclosure provides a plurality of thermal structures connected to the passive element to form a plurality of thermal paths. And, the amount of the thermal structures is larger than the amount of the signal paths connecting the passive elements and the semiconductor die. The greater amount of heat from the passive element is transmitted to the thermal structures rather than to the semiconductor die. Therefore, the junction temperature of the semiconductor die may be less than about 150° C. The semiconductor package structure of the present disclosure can meet the above specification.

FIG. 1 illustrates a cross-sectional view of an example of a semiconductor package structure 1 according to some embodiments of the present disclosure. The semiconductor package structure 1 includes a semiconductor die 11, at least one wiring structure 12, a passive element 13, a plurality of signal vias 14, and a plurality of thermal structures 15. The semiconductor die 11 has an active surface 111 and a back surface 112 opposite to the active surface 111. In some embodiments, the semiconductor package structure 1 may further include a metal support 18. The semiconductor die 11 is disposed on the metal support 18. The metal support 18 is used for supporting the semiconductor die 11. The metal support 18 may be a leadframe.

The at least one wiring structure 12 is electrically connected to the active surface 111 of the semiconductor die 11. Thus, the active surface 111 faces the wiring structure 12. The passive element 13 is electrically connected to the semiconductor die 11. The signal vias 14 are electrically connecting the passive element 13 and the semiconductor die 11. The thermal structures 15 are connected to the passive element 13, and the thermal structures 15 are disposed on a periphery of the at least one wiring structure 12.

In some embodiments, the at least one wiring structure 12 includes a first circuit layer 121 and a second circuit layer 122. The first circuit layer 121 is electrically connected to the passive element 13, and the second circuit layer 122 is electrically connected to the signal vias 14. The wiring structure 12 may include a first dielectric layer 123 and a second dielectric layer 124. The first circuit layer 121 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The first circuit layer 121 may include the signal vias 14 disposed in the through hole of the first dielectric layer 123, and at least one conductive pad. That is, the signal vias 14 may be a portion of the first circuit layer 121 and a portion of the wiring structure 12. In some embodiments, the first circuit layer 121 may further include at least one trace.

In some embodiments, the first dielectric layer 123 covers the second circuit layer 122, and the first dielectric layer 123 surrounds the first circuit layer 121 and the signal vias 14. The first dielectric layer 123 may be made of an insulating material or a dielectric material, such as, for example, polypropylene (PP). It is noted that the first dielectric layer 123 may include, or be formed from, a cured photoimageable dielectric (PID) material such as epoxy or polyimide (PI) including photoinitiators. The first dielectric layer 123 defines at least one through hole extending through the first dielectric layer 123.

In some embodiments, the second circuit layer 122 is disposed on the second dielectric layer 124, and the second circuit layer 122 is electrically connected to the first circuit layer 121 by the signal vias 14. The second circuit layer 122 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The second circuit layer 122 may include at least one conductive via 125 disposed in the through hole of the second dielectric layer 124, and at least one conductive pad. In some embodiments, the second circuit layer 122 may further include at least one trace.

In some embodiments, the second dielectric layer 124 surrounds the semiconductor die 11, the conductive via 125 and the metal support 18. The second dielectric layer 124 may be made of an insulating material or a dielectric material, such as, for example, polypropylene (PP). It is noted that the second dielectric layer 124 may include, or be formed from, a cured photoimageable dielectric (PID) material such as epoxy or polyimide (PI) including photoinitiators. The first dielectric layer 123 and the second dielectric layer 124 may be an isolation material.

In some embodiments, the passive element 13 (e.g., an inductor) includes two electrodes 131, 132 electrically connected to the signal vias 14 and connected to the thermal structures 15. The two electrodes 131, 132 are formed as an L shape. In some embodiments, the two electrodes 131, 132 of the passive element 13 are disposed on the first circuit layer 121, and are electrically connected to the first circuit layer 121. The first circuit layer 121 is electrically connected to the signal vias 14 and is connected to the thermal structures 15.

In some embodiments, the thermal structures 15 are thermal vias. The thermal structures 15 may include a plurality of first thermal vias 151, a plurality of second thermal vias 152 and a plurality of first thermal pads 153. The first thermal vias 151 are connected to the first circuit layer 121. The first thermal pads 153 are disposed between the first thermal vias 151 and the second thermal vias 152, and are connected to the first thermal vias 151 and the second thermal vias 152. In some embodiments, the first thermal pads 153 and the second thermal vias 152 are formed at the same time as the second circuit layer 122 and the at least one conductive via 125, respectively. The second dielectric layer 124 surrounds the second thermal vias 152, and the first thermal pads 153 is disposed on the second dielectric layer 124.

In some embodiments, an amount of the thermal structures 15 may be larger than ten times an amount of the signal vias 14. That is, the amount of the first thermal vias 151 may be larger than ten times the amount of the signal vias 14, or the amount of the second thermal vias 152 may be larger than ten times the amount of the signal vias 14. In some embodiments, the amount of the thermal structures 15 may be larger than sixteen times the amount of the signal vias 14. That is, the amount of the first thermal vias 151 may be larger than sixteen times the amount of the signal vias 14, or the amount of the second thermal vias 152 may be larger than sixteen times the amount of the signal vias 14. Therefore, the most heat from the passive element 13 is transmitted to the thermal structures 15 rather than to the semiconductor die 11. The junction temperature of the semiconductor die 11 may be less than about 150° C. The semiconductor package structure 1 of the present disclosure can meet the design specifications.

In some embodiments, the metal support 18 includes a die pad 181, a plurality of signal pins 182, and a plurality of thermal pins 183. The die pad 181, the signal pins 182 and the thermal pins 183 are isolated from each other. The semiconductor die 11 is disposed on the die pad 181 of the metal support 18. The back surface 112 of the semiconductor die 11 is attached to the die pad 181 of the metal support 18 by adhesion. The signal pins 182 are electrically connected to the signal vias 14. The thermal pins 183 are connected to the thermal structures 15. In some embodiments, the thermal pins 183 are connected to the second thermal vias 152 of the thermal structures 15. The major part of the heat from the passive element 13 may be transmitted to the thermal structures 15 and the thermal pins 183, and such heat may be dissipated to outside so as to reduce the temperature of the semiconductor package structure 1. In some embodiments, the thermal pins 183 may be a portion of the thermal structures 15. Thus, the thermal structures 15 penetrate through the isolation material including the first dielectric layer 123 and the second dielectric layer 124.

In some embodiments, the semiconductor package structure 1 may further include a protection layer 19 disposed on the first dielectric layer 123. The protection layer 19 may include, or be formed from, a cured photoimageable dielectric (PID) material such as epoxy or polyimide (PI) including photoinitiators, or a solder resist layer.

Figure 2:
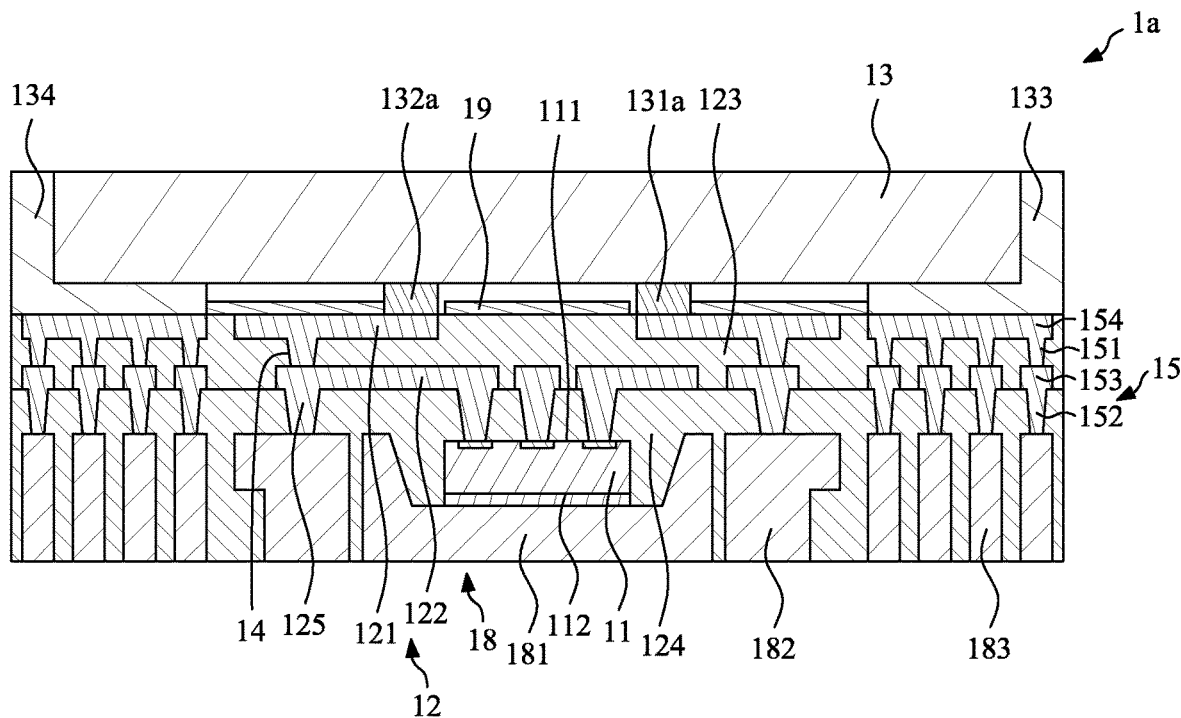
FIG. 2 illustrates a cross-sectional view of an example of a semiconductor package structure according to some embodiments of the present disclosure.

FIG. 2 illustrates a cross-sectional view of an example of a semiconductor package structure 1a according to some embodiments of the present disclosure. The semiconductor package structure 1a shown in FIG. 2 is similar to the semiconductor package structure 1 shown in FIG. 1, and the differences are described as follows. In some embodiments, the passive element 13 includes two electrodes 131a, 132a and two metal pins 133, 134. The two electrodes 131a, 132a are electrically connected to the signal vias 14, and the two metal pins 133, 134 are connected to the thermal structures 15. The two electrodes 131a, 132a of the passive element 13 are disposed on the first circuit layer 121, and are electrically connected to the first circuit layer 121. The thermal structures 15 may further include a first thermal layer 154 that is separated from the first circuit layer 121. The two metal pins 133, 134 are disposed on the first thermal layer 154, and are connected to the first thermal layer 154. The first thermal layer 154 is connected to the first thermal vias 151. Because the two electrodes 131a, 132a and two metal pins 133, 134 are separated, the most heat from the passive element 13 is transmitted to the thermal structures 15 by the two metal pins 133, 134 so as to reduce the junction temperature of the semiconductor die 11.

Figure 3:
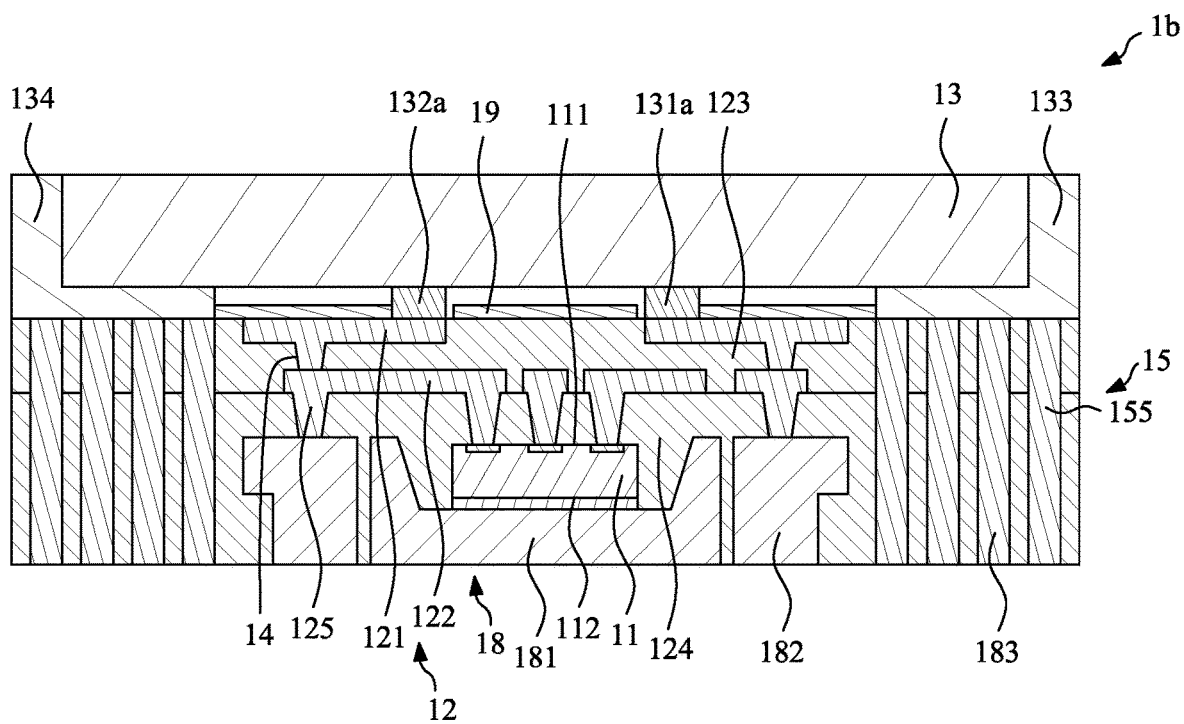
FIG. 3 illustrates a cross-sectional view of an example of a semiconductor package structure according to some embodiments of the present disclosure.

FIG. 3 illustrates a cross-sectional view of an example of a semiconductor package structure 1b according to some embodiments of the present disclosure. The semiconductor package structure 1b shown in FIG. 3 is similar to the semiconductor package structure 1a shown in FIG. 2, and the differences are described as follows. In some embodiments, the thermal structures 15 may include a plurality of metal pillars 155 penetrating through the isolation material including the first dielectric layer 123 and the second dielectric layer 124. The metal pillars 155 are connected to the two metal pins 133, 134 to transmit the most heat from the passive element 13 to outside. In some embodiments, the amount of the metal pillars 155 may be larger than ten times the amount of the signal vias 14. In some embodiments, the amount of the metal pillars 155 may be larger than sixteen times the amount of the signal vias 14.

Figure 4:
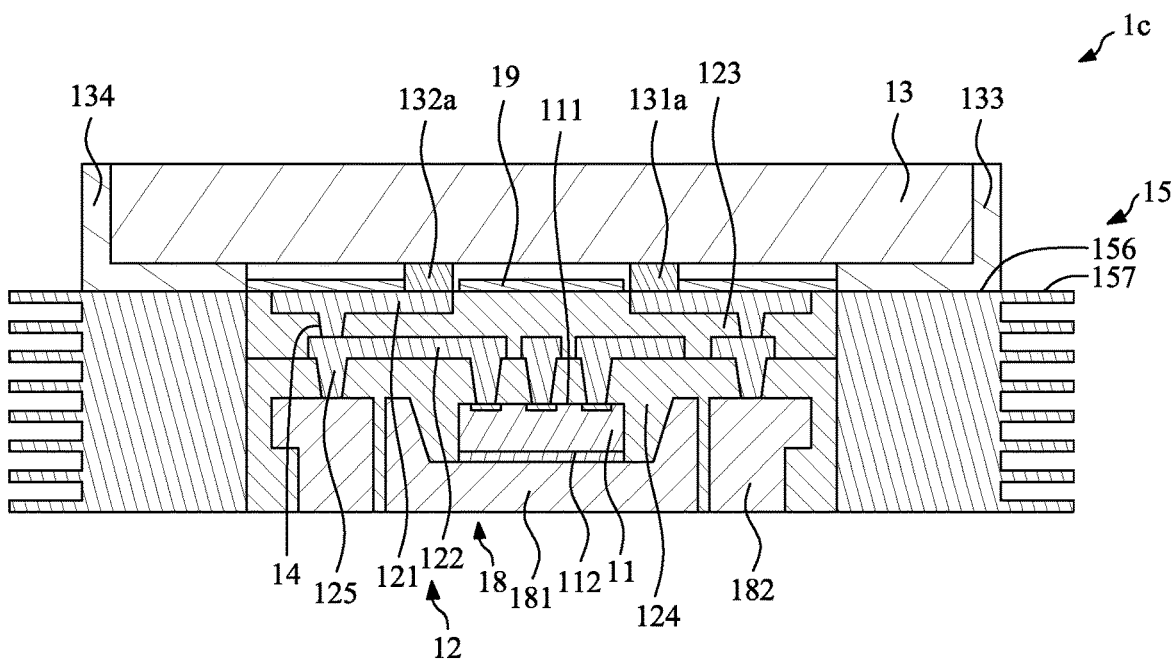
FIG. 4 illustrates a cross-sectional view of an example of a semiconductor package structure according to some embodiments of the present disclosure.

FIG. 4 illustrates a cross-sectional view of an example of a semiconductor package structure 1c according to some embodiments of the present disclosure. The semiconductor package structure 1c shown in FIG. 4 is similar to the semiconductor package structure 1a shown in FIG. 2, and the differences are described as follows. In some embodiments, the thermal structures 15 may include thermal plates 156. The thermal plates 156 are connected to the two metal pins 133, 134. In some embodiments, a total area of the thermal plates 156 may be larger than ten times a total area of the signal vias 14. In some embodiments, a total area of the thermal plates 156 may be larger than sixteen times a total area of the signal vias 14. In some embodiments, the thermal structures 15 may further include a plurality of thermal fins 157 extending from the thermal plates 156.

Figure 5:
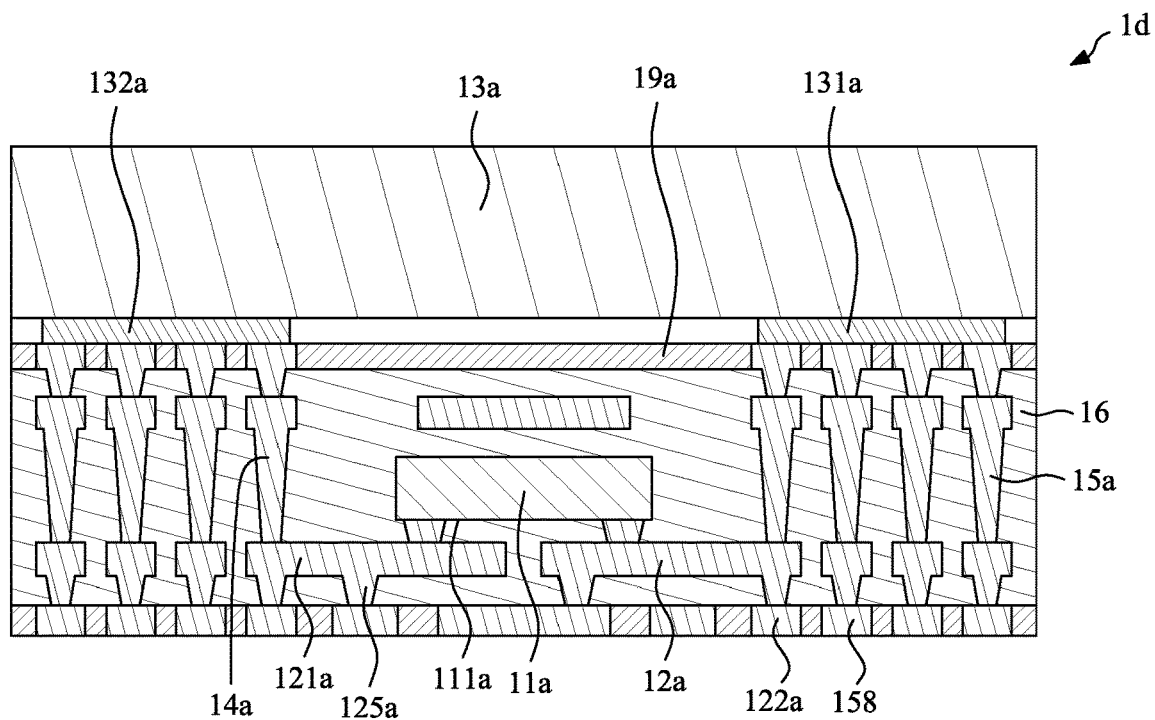
FIG. 5 illustrates a cross-sectional view of an example of a semiconductor package structure according to some embodiments of the present disclosure.

FIG. 5 illustrates a cross-sectional view of an example of a semiconductor package structure 1d according to some embodiments of the present disclosure. The semiconductor package structure 1d includes a semiconductor die 11a, at least one wiring structure 12a, a passive element 13a, a plurality of signal vias 14a, and a plurality of thermal structures 15a. The semiconductor die 11a has an active surface 111a. The at least one wiring structure 12a is electrically connected to the active surface 111a of the semiconductor die 11a. Thus, the active surface 111a faces the wiring structure 12a. The passive element 13 is electrically connected to the semiconductor die 11a. The passive element 13a includes two electrodes 131a, 132a electrically connected to the signal vias 14a and is connected to the thermal structures 15a. The signal vias 14a are electrically connecting the passive element 13a and the semiconductor die 11a. In some embodiments, the passive element 13a is electrically connected to the semiconductor die 11a by the signal path including the signal vias 14a and the first circuit layer 121a of the wiring structure 12a. The signal path may further include the second circuit layer 122a and the conductive via 125a electrically connected to the external device. The thermal structures 15a are connected to the passive element 13a, and the thermal structures 15a are disposed on a periphery of the at least one wiring structure 12a. In some embodiments, the thermal structures 15a may include a second thermal layer 158 to transmit the most heat from the passive element 13a to outside.

In some embodiments, the semiconductor package structure 1d may further include a dielectric layer 16 surrounding the semiconductor die 11a. That is, the semiconductor die 11a is embedded in the dielectric layer 16. The material of the dielectric layer 16 may be a prepreg. In some embodiments, the semiconductor package structure 1d may further include a protection layer 19a disposed on the dielectric layer 16. The dielectric layer 16 may be an isolation material. The thermal structures 15a include a plurality of thermal vias. The thermal vias penetrate through the dielectric layer 16.

In some embodiments, an amount of the thermal structures 15a may be larger than ten times an amount of the signal vias 14a. In some embodiments, the amount of the thermal structures 15a may be larger than sixteen times the amount of the signal vias 14a.

Figure 6:
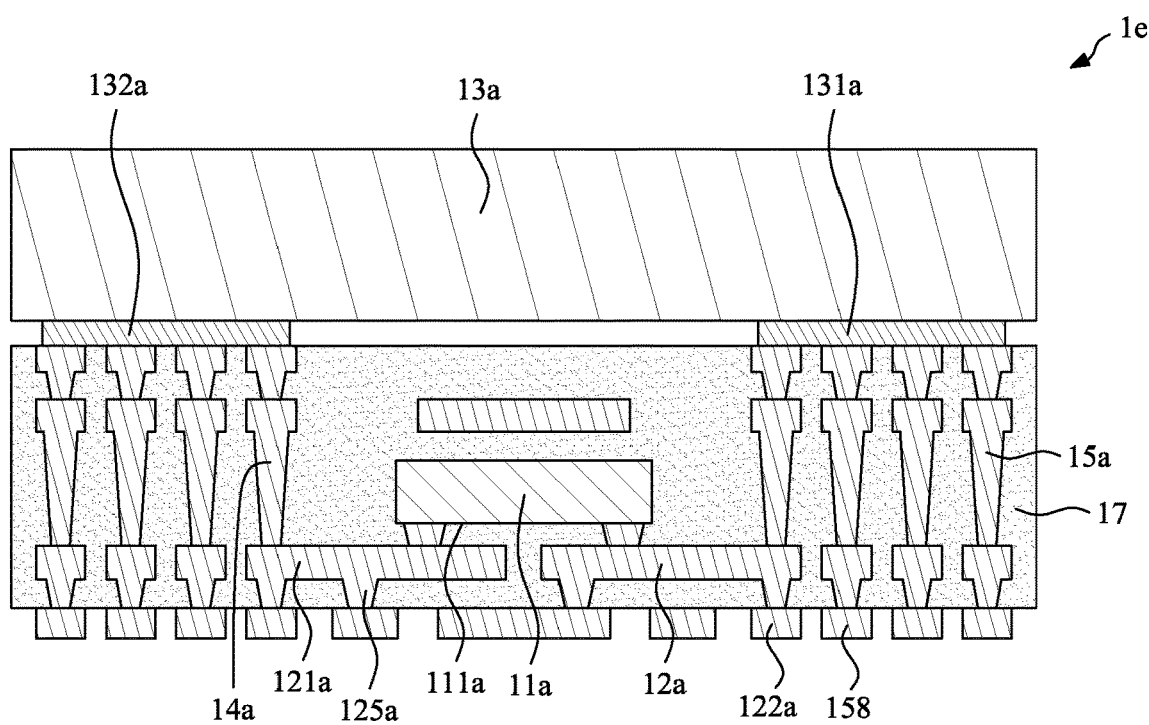
FIG. 6 illustrates a cross-sectional view of an example of a semiconductor package structure according to some embodiments of the present disclosure.

FIG. 6 illustrates a cross-sectional view of an example of a semiconductor package structure 1e according to some embodiments of the present disclosure. The semiconductor package structure 1e shown in FIG. 6 is similar to the semiconductor package structure 1d shown in FIG. 5, and the differences are described as follows. In some embodiments, the semiconductor package structure 1e may further include an encapsulant 17 (e.g., molding compound) surrounding the semiconductor die 11a. That is, the semiconductor die 11a is embedded in the encapsulant 17. The encapsulant 17 may be an isolation material. The thermal structures 15a include a plurality of thermal vias. The thermal vias penetrate through the encapsulant 17.

Figure 7:
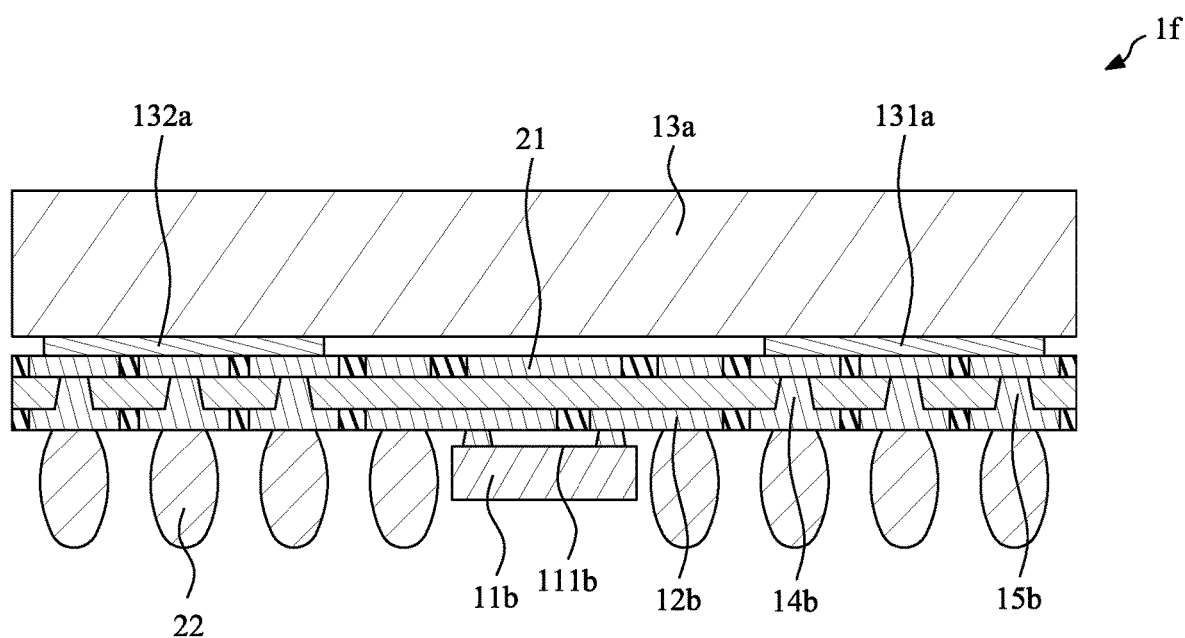
FIG. 7 illustrates a cross-sectional view of an example of a semiconductor package structure according to some embodiments of the present disclosure.

FIG. 7 illustrates a cross-sectional view of an example of a semiconductor package structure 1f according to some embodiments of the present disclosure. The semiconductor package structure 1f includes a semiconductor die 11b, at least one wiring structure 12b, a passive element 13a, a plurality of signal vias 14b, and a plurality of thermal structures 15b. The semiconductor die 11b has an active surface 111b. The at least one wiring structure 12b is electrically connected to the active surface 111b of the semiconductor die 11b. Thus, the active surface 111b faces the wiring structure 12b. The passive element 13a is electrically connected to the semiconductor die 11b. The passive element 13a includes two electrodes 131a, 132a electrically connected to the signal vias 14b and the thermal structures 15b. In some embodiments, the passive element 13a is electrically connected to the semiconductor die 11b by the signal path including the signal vias 14b and the wiring structure 12b. The signal vias 14b are electrically connecting the passive element 13a and the semiconductor die 11b. The thermal structures 15b are connected to the passive element 13a, and the thermal structures 15b are disposed on a periphery of the at least one wiring structure 12b.

In some embodiments, the semiconductor package structure 1f may further include at least one antenna structure 21 electrically connected to the semiconductor die 11b. In some embodiments, the semiconductor package structure 1f may further include a plurality of conductive elements 22 (e.g., solder balls) electrically connecting the at least one wiring structure 12b and connecting the thermal structures 15b.

In some embodiments, an amount of the thermal structures 15b may be larger than ten times an amount of the signal vias 14b. In some embodiments, the amount of the thermal structures 15b may be larger than sixteen times the amount of the signal vias 14b.

Figure 8:
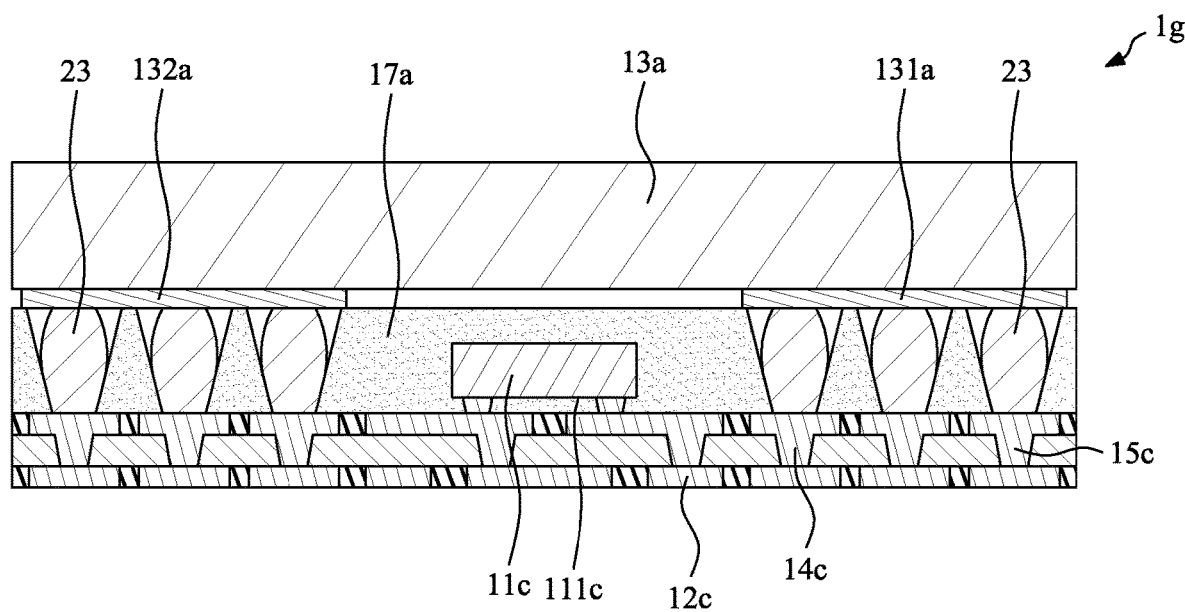
FIG. 8 illustrates a cross-sectional view of an example of a semiconductor package structure according to some embodiments of the present disclosure.

FIG. 8 illustrates a cross-sectional view of an example of a semiconductor package structure 1g according to some embodiments of the present disclosure. The semiconductor package structure 1g includes a semiconductor die 11c, at least one wiring structure 12c, a passive element 13a, a plurality of signal vias 14c, and a plurality of thermal structures 15c. The semiconductor die 11c has an active surface 111c. The at least one wiring structure 12c is electrically connected to the active surface 111c of the semiconductor die 11c. Thus, the active surface 111c faces the wiring structure 12c. The passive element 13a is electrically connected to the semiconductor die 11c. The signal vias 14c are electrically connecting the passive element 13a and the semiconductor die 11c. The thermal structures 15c are connected to the passive element 13a, and the thermal structures 15c are disposed on a periphery of the at least one wiring structure 12c.

In some embodiments, the semiconductor package structure 1g may further include an encapsulant 17a (e.g., molding compound) surrounding the semiconductor die 11c. In some embodiments, the semiconductor package structure 1g may further include a plurality of conductive elements 23 (e.g., solder balls) electrically connecting the passive element 13a and the at least one wiring structure 12c. In some embodiments, conductive elements 23 may be a portion of the thermal structures 15c. Thus, the thermal structures 15c penetrate through the encapsulant 17a.

In some embodiments, an amount of the thermal structures 15c may be larger than ten times an amount of the signal vias 14c. In some embodiments, the amount of the thermal structures 15c may be larger than sixteen times the amount of the signal vias 14c.

Figure 9:
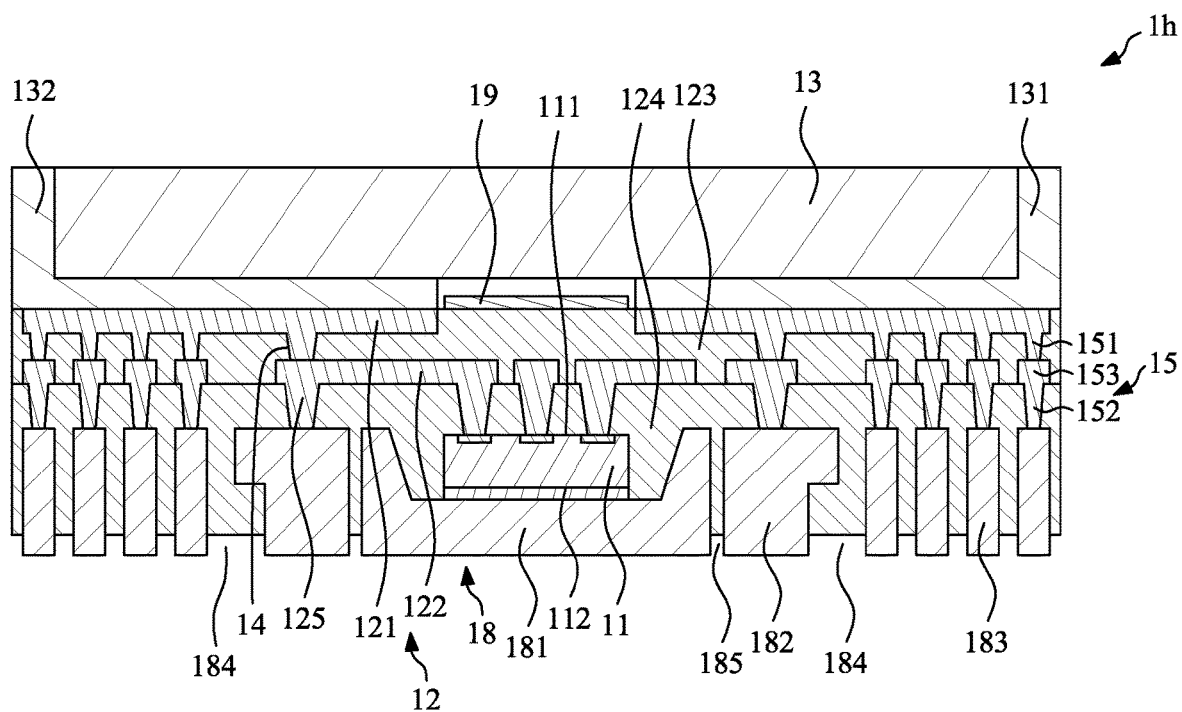
FIG. 9 illustrates a cross-sectional view of an example of a semiconductor package structure according to some embodiments of the present disclosure.

FIG. 9 illustrates a cross-sectional view of an example of a semiconductor package structure 1h according to some embodiments of the present disclosure. The semiconductor package structure 1h shown in FIG. 1 is similar to the semiconductor package structure 1 shown in FIG. 1, and the differences are described as follows. In some embodiments, the semiconductor package structure 1h further includes a plurality of first recess portions 184 are formed between the signal pins 182 and the thermal pins 183, so that the signal pins 182 and the thermal pins 183 are isolated from each other. In some embodiments, the semiconductor package structure 1h further includes a plurality of second recess portions 185 are formed between the signal pins 182 and the die pad 181, so that the signal pins 182 and the die pad 181 are isolated from each other.

Figure 10:
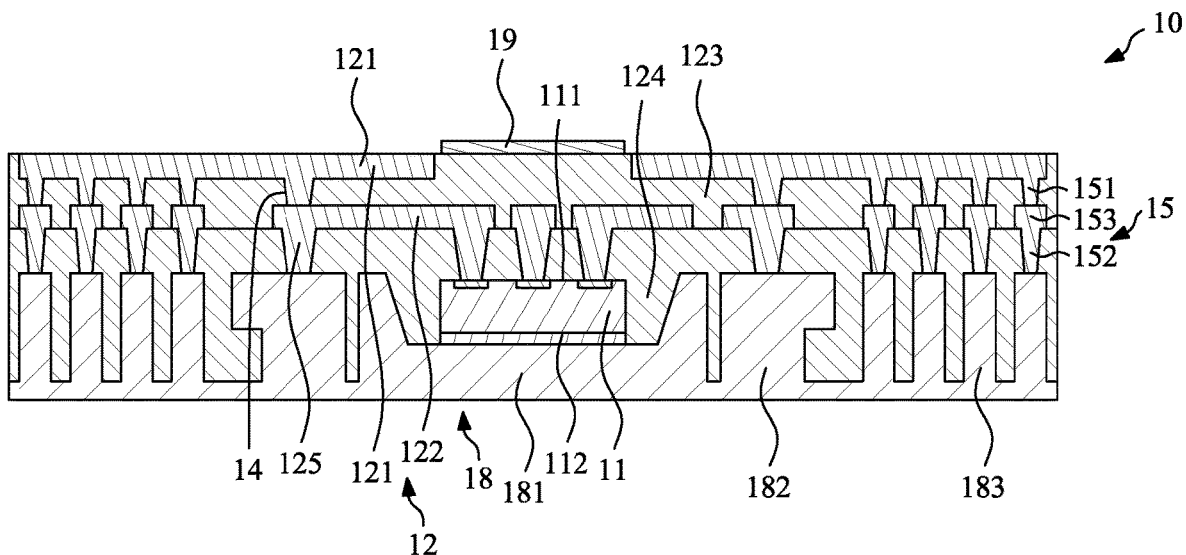
FIG. 10 illustrates one or more stages of an example of a semiconductor manufacturing process according to some embodiments of the present disclosure.
Figure 11:
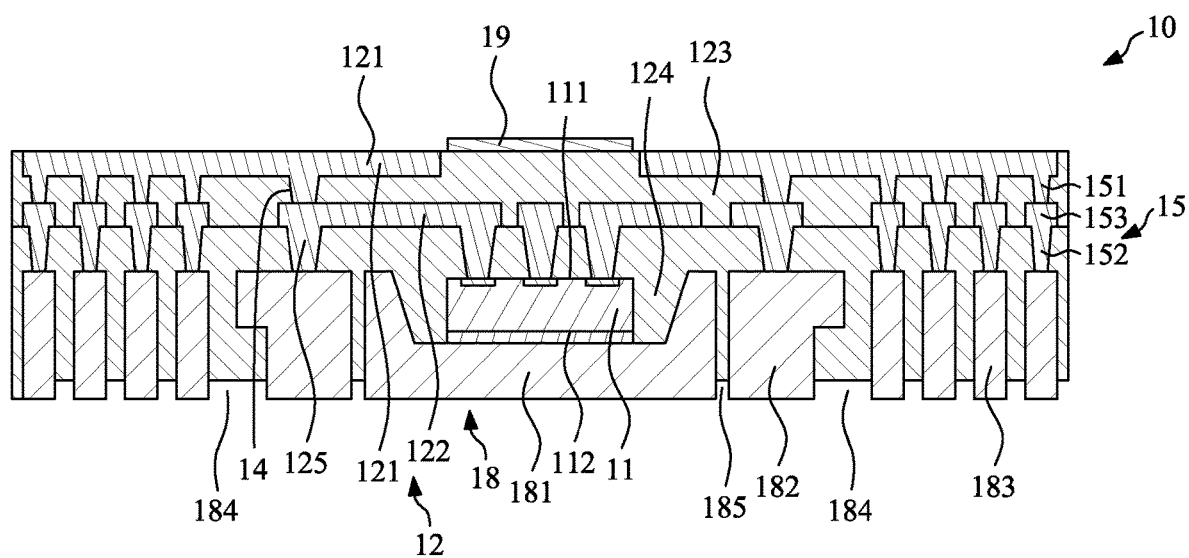
FIG. 11 illustrates one or more stages of an example of a semiconductor manufacturing process according to some embodiments of the present disclosure.

FIGS. 10 to 11 illustrate a semiconductor manufacturing process according to some embodiments of the present disclosure. In some embodiments, the semiconductor manufacturing process is for manufacturing a semiconductor package structure such as the semiconductor package structure 1h shown in FIG. 9.

Referring to FIG. 10, a semiconductor package 10 is provided. The semiconductor package 10 includes a semiconductor die 11, at least one wiring structure 12, a plurality of signal vias 14 and a plurality of thermal structures 15. The semiconductor die 11 includes an active surface 111 and a back surface 112. The at least one wiring structure 12 is electrically connected to the active surface 111 of the semiconductor die 11. The signal vias 14 are electrically connected to the semiconductor die 11. The thermal structures 15 are disposed on a periphery of the at least one wiring structure 12.

In some embodiments, the at least one wiring structure 12 includes a first circuit layer 121 and a second circuit layer 122. The first circuit layer 121 is electrically connected to the passive element 13, and the second circuit layer 122 is electrically connected to the signal vias 14. The wiring structure 12 may include a first dielectric layer 123 and a second dielectric layer 124. The first circuit layer 121 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The first circuit layer 121 may include the signal vias 14 disposed in the through hole of the first dielectric layer 123, and at least one conductive pad. That is, the signal vias 14 may be a portion of the first circuit layer 121 and a portion of the wiring structure 12. In some embodiments, the first circuit layer 121 may further include at least one trace.

In some embodiments, the first dielectric layer 123 covers the second circuit layer 122, and the first dielectric layer 123 surrounds the first circuit layer 121 and the signal vias 14. The first dielectric layer 123 may be made of an insulating material or a dielectric material, such as, for example, polypropylene (PP). It is noted that the first dielectric layer 123 may include, or be formed from, a cured photoimageable dielectric (PID) material such as epoxy or polyimide (PI) including photoinitiators. The first dielectric layer 122 defines at least one through hole extending through the first dielectric layer 122.

In some embodiments, the second circuit layer 122 is disposed on the second dielectric layer 124, and the second circuit layer 122 is electrically connected to the first circuit layer 121 by the signal vias 14. The second circuit layer 122 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The second circuit layer 122 may include at least one conductive via 125 disposed in the through hole of the second dielectric layer 124, and at least one conductive pad. In some embodiments, the second circuit layer 122 may further include at least one trace.

In some embodiments, the second dielectric layer 124 surrounds the semiconductor die 11, the conductive via 125 and the metal support 18. The second dielectric layer 124 may be made of an insulating material or a dielectric material, such as, for example, polypropylene (PP). It is noted that the second dielectric layer 124 may include, or be formed from, a cured photoimageable dielectric (PID) material such as epoxy or polyimide (PI) including photoinitiators.

In some embodiments, the thermal structures 15 are thermal vias. The thermal structures 15 may include a plurality of first thermal vias 151, a plurality of second thermal vias 152 and a plurality of first thermal pads 153. The first thermal vias 151 are connected to the first circuit layer 121. The first thermal pads 153 are disposed between the first thermal vias 151 and the second thermal vias 152, and are connected to the first thermal vias 151 and the second thermal vias 152. In some embodiments, the first thermal pads 153 and the second thermal vias 152 are formed at the same time as the second circuit layer 122 and the at least one conductive via 125. The second dielectric layer 124 surrounds the second thermal vias 152, and the first thermal pads 153 is disposed on the second dielectric layer 124.

In some embodiments, an amount of the thermal structures 15 may be larger than ten times an amount of the signal vias 14. That is, the amount of the first thermal vias 151 may be larger than ten times the amount of the signal vias 14, or the amount of the second thermal vias 152 may be larger than ten times the amount of the signal vias 14. In some embodiments, the amount of the thermal structures 15 may be larger than sixteen times the amount of the signal vias 14. That is, the amount of the first thermal vias 151 may be larger than sixteen times the amount of the signal vias 14, or the amount of the second thermal vias 152 may be larger than sixteen times the amount of the signal vias 14.

In some embodiments, the metal support 18 includes a die pad 181, a plurality of signal pins 182, and a plurality of thermal pins 183. The semiconductor die 11 is mounted on the die pad 181 of the metal support 18. The back surface 112 of the semiconductor die 11 is disposed on the die pad 181 of the metal support 18. The signal pins 182 are electrically connected to the signal vias 14. The thermal pins 183 are connected to the thermal structures 15. In some embodiments, the thermal pins 183 are connected to the second thermal vias 152 of the thermal structures 15. In some embodiments, the die pad 181 is connected to the signal pins 182, and the signal pins 182 are connected to the thermal pins 183.

In some embodiments, the semiconductor package structure 1 may further include a protection layer 19 disposed on the first dielectric layer 123. The protection layer 19 may include, or be formed from, a cured photoimageable dielectric (PID) material such as epoxy or polyimide (PI) including photoinitiators, or a solder resist layer.

Referring to FIG. 11, a plurality of first recess portions 184 and a plurality of second recess portions 185 are formed by etching. The first recess portions 184 are formed to expose portion of the second dielectric layer 124, and the first recess portions 184 are formed between the signal pins 182 and the thermal pins 183. The second recess portions 185 are formed to expose portion of the second dielectric layer 124, and the second recess portions 185 are formed between the signal pins 182 and the die pad 181. Therefore, the signal pins 182 and the thermal pins 183 are isolated from each other, and the signal pins 182 and the die pad 181 are isolated from each other.

Then, the passive element 13 is mounted on the semiconductor package 10 to form the semiconductor package structure 1h as shown in FIG. 9. The passive element 13 is electrically connected to the signal vias 14 and is connected to the thermal structures 15. In some embodiments, the passive element 13 includes two electrodes 131, 132 electrically connected to the signal vias 14 and connected to the thermal structures 15. The two electrodes 131, 132 are formed as an L shape. In some embodiments, the two electrodes 131, 132 of the passive element 13 are disposed on the first circuit layer 121, and are electrically connected to the first circuit layer 121. The first circuit layer 121 is electrically connected to the signal vias 14 and is connected to the thermal structures 15.

Figure 12:
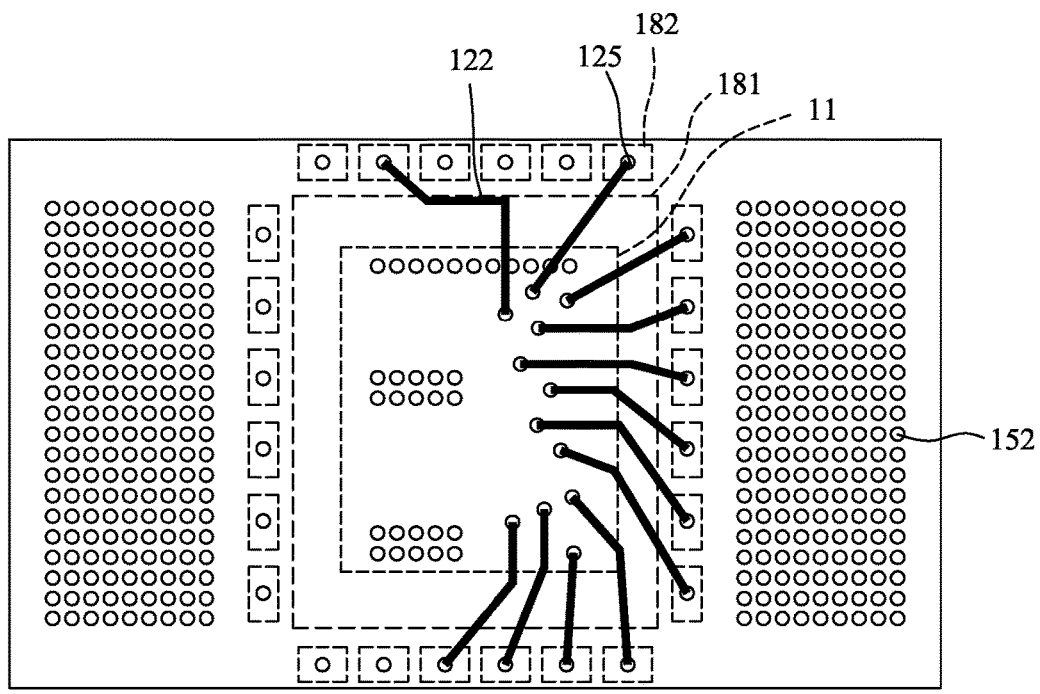
FIG. 12 illustrates a top view of an example of a semiconductor package structure according to some embodiments of the present disclosure.

FIG. 12 illustrates a top view of an example of a semiconductor package structure 1 from the second circuit layer 122 according to some embodiments of the present disclosure. That is, FIG. 12 is a top view of an example of a semiconductor package structure 1 removing the passive element 13 (FIG. 1), the protection layer 19 (FIG. 1), the first dielectric layer 123 (FIG. 1) and the first circuit layer 121 (FIG. 1). In some embodiments, an amount of the second thermal vias 152 may be larger than ten times an amount of the signal vias 14 (FIG. 1). In some embodiments, the amount of the second thermal vias 152 may be larger than sixteen times the amount of the signal vias 14 (FIG. 1). Therefore, the most heat from the passive element 13 (FIG. 1) is transmitted to the thermal structures 15 (FIG. 1) rather than to the semiconductor die 11. The junction temperature of the semiconductor die 11 may be less than about 150° C. The semiconductor package structure 1 (FIG. 1) of the present disclosure can meet the design specifications.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a passive element including a main body, an electrode and a metal pin spaced apart from the electrode, wherein the electrode is configured to transmit a signal from the main body, and the metal pin is configured to transmit a heat generated by the main body and includes a first portion and a base portion connected to the first portion and wider than the first portion; and
a dielectric layer disposed between the electrode and the metal pin,
wherein the dielectric layer is spaced apart from a portion of the electrode, the base portion is substantially level with the electrode, and a width of the electrode is less than a width of the base portion of the metal pin.

2. The semiconductor package structure of claim 1, further comprising a signal circuit electrically connected to the electrode and a thermal structure thermally connected to the metal pin, wherein the thermal structure is spaced apart from the signal circuit.

3. The semiconductor package structure of claim 2, wherein the thermal structure includes a thermal layer, the base portion of the metal pin includes a first region directly contacting the thermal layer and a second region not contacting the thermal layer, and a width of the first region is greater than a width of the second region.

4. The semiconductor package structure of claim 3, wherein a width of the thermal layer is less than a width of the metal pin.

5. The semiconductor package structure of claim 4, wherein the thermal structure further includes a plurality of thermal vias directly contacting the thermal layer.

6. The semiconductor package structure of claim 1, further comprising a thermal structure thermally connected to the metal pin and including a plurality of thermal vias arranged in a two-dimensional array.

7. The semiconductor package structure of claim 1, further comprising a plurality of signal vias electrically connected to the passive element and comprising a plurality of thermal vias thermally connected to the metal pin, wherein in a top view, a total number of the plurality of thermal vias is greater than a total number of the plurality of signal vias.

8. The semiconductor package structure of claim 1, further comprising a plurality of thermal vias thermally connected to the metal pin to transmit the heat from the main body, wherein the plurality of thermal vias are entirely disposed within a vertical projection of the metal pin.

* * * * *